(12) United States Patent
Kim et al.

(10) Patent No.: US 9,312,125 B2
(45) Date of Patent: Apr. 12, 2016

(54) CYCLIC DEPOSITION METHOD FOR THIN FILM FORMATION, SEMICONDUCTOR MANUFACTURING METHOD, AND SEMICONDUCTOR DEVICE

(71) Applicant: Eugene Technology Co., Ltd., Yongin-si (KR)

(72) Inventors: Hai-Won Kim, Icheon-si (KR); Seok-Yun Kim, Yongin-si (KR); Chang-Hun Shin, Icheon-si (KR); Jeong-Hoon Lee, Suwon-si (KR)

(73) Assignee: Eugene Technology Co., Ltd., Yongin-si (KR)

( * ) Notice: Subject to any disclaimer, the term of this patent is extended or adjusted under 35 U.S.C. 154(b) by 0 days.

(21) Appl. No.: 14/580,582

(22) Filed: Dec. 23, 2014

(65) Prior Publication Data

US 2015/0187560 A1   Jul. 2, 2015

(30) Foreign Application Priority Data

Dec. 27, 2013   (KR) .................. 10-2013-0165686

(51) Int. Cl.
*H01L 21/31*   (2006.01)
*H01L 21/469*   (2006.01)
*H01L 21/02*   (2006.01)

(52) U.S. Cl.
CPC ........ *H01L 21/0228* (2013.01); *H01L 21/0262* (2013.01); *H01L 21/02164* (2013.01); *H01L 21/02274* (2013.01); *H01L 21/02532* (2013.01); *H01L 21/02592* (2013.01); *H01L 21/02595* (2013.01)

(58) Field of Classification Search
CPC ............... C23C 16/4554; H01L 21/02219
USPC .................................. 438/788, 792
See application file for complete search history.

(56) References Cited

U.S. PATENT DOCUMENTS

| | | | |
|---|---|---|---|
| 5,242,530 A * | 9/1993 | Batey et al. ............... | 117/90 |
| 7,326,438 B2 * | 2/2008 | Um .................. | 427/255.394 |
| 8,658,259 B2 * | 2/2014 | Nguyen et al. ............ | 427/535 |
| 8,828,890 B2 * | 9/2014 | Kim et al. ................ | 438/788 |
| 2008/0038936 A1 * | 2/2008 | Todd et al. ............... | 438/787 |
| 2009/0041952 A1 * | 2/2009 | Yoon et al. ............... | 427/579 |
| 2010/0196625 A1 * | 8/2010 | Yoon et al. ............... | 427/569 |
| 2010/0206231 A1 * | 8/2010 | Yoon et al. ............... | 118/723.1 |
| 2010/0276393 A1 * | 11/2010 | Woo et al. ............... | 216/68 |

(Continued)

FOREIGN PATENT DOCUMENTS

JP   2011-222649   11/2011
KR   10-2005-0060268 A   6/2005

(Continued)

*Primary Examiner* — Earl Taylor
(74) *Attorney, Agent, or Firm* — The Webb Law Firm

(57) ABSTRACT

A cyclic deposition method for thin film formation includes forming a silicon thin film on an object by injecting a silicon precursor into a chamber in which the object is loaded, depositing silicon on the object, and performing a first purge, removing an unreacted portion of the silicon precursor and reaction by-products from the interior of the chamber, pre-processing a surface of the silicon thin film by forming a plasma atmosphere in the chamber and supplying a first reaction source having a hydrogen atom, and forming the silicon thin film as an insulating film including silicon, by forming the plasma atmosphere in the chamber and supplying a second reaction source having one or more oxygen atoms, one or more nitrogen atoms, or a mixture thereof.

15 Claims, 8 Drawing Sheets

(56) References Cited

U.S. PATENT DOCUMENTS

| | | | |
|---|---|---|---|
| 2010/0319621 A1* | 12/2010 | Woo et al. | 118/723 R |
| 2010/0319855 A1* | 12/2010 | Lee et al. | 156/345.34 |
| 2010/0330301 A1* | 12/2010 | Yang | 427/578 |
| 2011/0000618 A1* | 1/2011 | Yang | 156/345.33 |
| 2011/0014397 A1* | 1/2011 | Yang | 427/569 |
| 2013/0101752 A1* | 4/2013 | Kim et al. | 427/539 |
| 2013/0115783 A1* | 5/2013 | Kim et al. | 438/788 |
| 2013/0130480 A1* | 5/2013 | Kim et al. | 438/479 |
| 2015/0187560 A1* | 7/2015 | Kim et al. | 438/788 |

FOREIGN PATENT DOCUMENTS

| | | | |
|---|---|---|---|
| KR | 20120012579 A | * | 2/2012 |
| KR | 10-1147727 B1 | | 5/2012 |
| WO | WO 2012018210 A2 | * | 2/2012 |
| WO | WO 2012018210 A3 | * | 5/2012 |

* cited by examiner

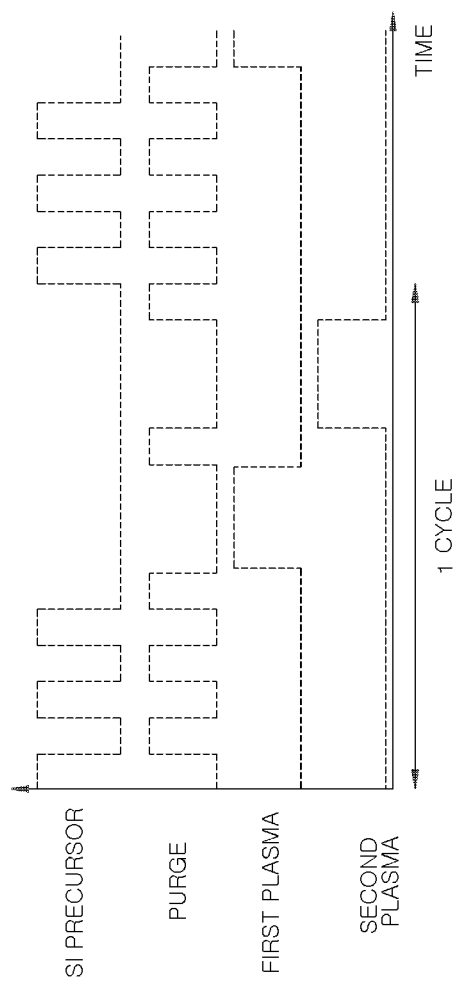

CYCLIC DEPOSITION METHOD FOR THIN FILM FORMATION, SEMICONDUCTOR MANUFACTURING METHOD, AND SEMICONDUCTOR DEVICE

CROSS-REFERENCE TO RELATED APPLICATION

This application claims the benefit of Korean Patent Application No. 10-2013-0165686 filed on Dec. 27, 2013, with the Korean Intellectual Property Office, the disclosure of which is incorporated herein by reference.

FIELD OF THE INVENTION

The present disclosure relates to a cyclic deposition method for thin film formation, a semiconductor manufacturing method, and a semiconductor device, and more particularly, to a cyclic deposition method for thin film formation, in which an insulating film is formed after a surface of a silicon film is pre-processed using generated plasma, a semiconductor manufacturing method, and a semiconductor device.

BACKGROUND OF THE INVENTION

Electronic devices are becoming ever more highly integrated with higher levels of performance due to developments in the semiconductor industry and in order to satisfy user demand. Accordingly, semiconductor devices, the core components in many electronic devices, are also required to be more highly integrated with higher levels of performance. However, realizing microstructures of semiconductor devices for high-integration is somewhat problematic.

For example, in order to realize microstructures, thinner insulating films are required; however, excessively thin insulating films cause problems in terms of reduced quality of insulating films, deterioration in insulation characteristics, and the like. Also, excessively thin films may lead to difficulties in obtaining good step coverage. Korean Patent Laid-Open Publication No. 2005-0060268 is of interest.

SUMMARY OF THE INVENTION

Some embodiments in the present disclosure may provide a cyclic deposition method for thin film formation capable of depositing an insulating film having a dense structure, a semiconductor manufacturing method, and a semiconductor device.

Some embodiments in the present disclosure may provide a cyclic deposition method for thin film formation capable of depositing an insulating film having excellent film qualities and step coverage, a semiconductor manufacturing method, and a semiconductor device.

According to an exemplary embodiment in the present disclosure, a cyclic deposition method for thin film formation may include: forming a silicon thin film on an object by injecting a silicon precursor into a chamber in which the object is loaded, depositing silicon on the object, and performing a first purge, removing an unreacted portion of the silicon precursor and reaction by-products from the interior of the chamber; pre-processing a surface of the silicon thin film by forming a plasma atmosphere in the chamber and supplying a first reaction source having a hydrogen atom; and forming the silicon thin film as an insulating film including silicon, by forming the plasma atmosphere in the chamber and supplying a second reaction source having one or more oxygen atoms, one more nitrogen atoms, or a mixture thereof.

The first reaction source may be one or more gases selected from a group consisting of $NH_3$ and $H_2$.

The second reaction source may be one or more gases selected from a group consisting of $O_2$, $O_3$, $N_2$, and $NH_3$.

The pre-processing may last 0.05 to 10 seconds.

The pre-processing may be performed under chamber pressure conditions of 0.01 to 10 Torr, and a temperature of the object may be 50 to 600° C.

The forming of the silicon thin film and the forming of the insulating film may be performed under chamber pressure conditions of 0.01 to 10 Torr.

The silicon precursor may include any one of an amino silane or a chloride silane.

The insulating film including silicon may be a silicon oxide film or a silicon insulating film.

The pre-processing or the forming of the insulating film may include injecting one or more ignition gases selected from a group consisting of Ar, He, Kr, and Xe.

The first reaction source may be injected in an amount of 10 to 2000 sccm, the ignition gas may be injected in an amount of 100 to 3000 sccm, and the second reaction source may be injected in an amount of 10 to 500 sccm.

The cyclic deposition method for thin film formation may further include performing a second purge removing reaction by-products from the interior of the chamber after the formation of the insulating film, and the forming of the silicon thin film, the pre-processing, the forming of the insulating film, and the second purge may be performed repeatedly.

The forming of the silicon thin film may include repeating the deposition and the first purge 1 to 10 times.

The forming of the silicon thin film may include forming the silicon thin film formed using amorphous silicon or polysilicon having polycrystalline characteristics.

According to an exemplary embodiment in the present disclosure, a semiconductor manufacturing method may include depositing an insulating film through the cyclic deposition method for thin film formation described above.

According to an exemplary embodiment in the present disclosure, a semiconductor device including an insulating film deposited by the cyclic deposition method for thin film formation described above may be characterized in that the insulating film may have a wet etch rate of 0.4 to 0.6.

BRIEF DESCRIPTION OF THE DRAWINGS

The above and other aspects, features and advantages of the present disclosure will be more clearly understood from the following detailed description taken in conjunction with the accompanying drawings, in which:

FIG. 3 is a diagram illustrating a process of the cyclic deposition method for thin film formation according to an exemplary embodiment in the present disclosure;

DETAILED DESCRIPTION OF THE INVENTION

Figure 1:
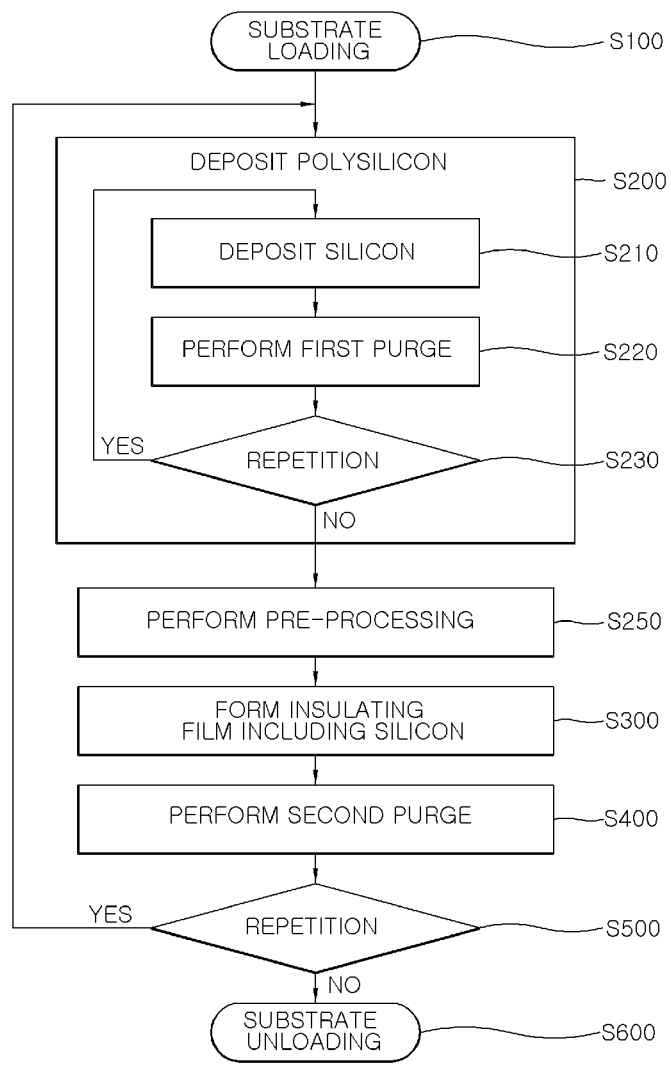
FIG. 1 is a flowchart illustrating a cyclic deposition method for thin film formation according to an exemplary embodiment in the present disclosure.

Hereinafter, exemplary embodiments in the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. Therefore, dimensions of elements in the drawings may be exaggerated for clarity, and the same reference numerals will be used throughout to designate the same or like elements.

FIG. 1 is a flowchart illustrating a cyclic deposition method for thin film formation according to an exemplary embodiment in the present disclosure. As illustrated in FIG. 1, a substrate may be loaded into a chamber of a semiconductor manufacturing apparatus in S100. A silicon thin film may be formed on the substrate loaded into the chamber in S200. In order to form the silicon thin film, a deposition of silicon S210 and a first purge S220 may be performed.

In order to deposit silicon, the silicon may be deposited on a surface of the substrate by injecting a silicon precursor into the chamber in S210. After the silicon is deposited on the surface of the substrate, the first purge S220 to remove an unreacted portion of the silicon precursor and reaction by-products may be performed. Then, the deposition of the silicon S210 and the first purge S220 may be performed repeatedly in S230, to form the silicon thin film on the surface of the substrate.

The deposition of the silicon S210 and the first purge S220, for example, may be repeated 1 to 10 times. In the deposition of a respective silicon S210, one to a plurality of silicon atomic layers may be formed on the surface of the substrate. Therefore, when the deposition of the silicon S210 and the first purge S220 are performed repeatedly in S230, the silicon thin film formed using amorphous silicon or polysilicon having polycrystalline characteristics may be formed on the surface of the substrate. The silicon thin film having the amorphous silicon or polycrystalline silicon may have a thickness of, for example, 1 to 10 Å.

Then, pre-processing may be performed on a surface of the silicon thin film in S250. In order to pre-process the surface of the silicon thin film, a plasma atmosphere may be formed in the interior of the chamber, and a first reaction source may be injected thereinto. The first reaction source may be a gas having a hydrogen atom such as $NH_3$ or $H_2$, and, for example, may be injected in an amount of 10 to 2000 sccm.

Then, the silicon thin film formed on the surface of the substrate may be formed as an insulating film S300 including silicon. The insulating film including silicon, for example, may be a silicon oxide film or a silicon nitride film. In order to form the silicon thin film as the insulating film including silicon, the plasma atmosphere may be formed in the interior of the chamber, and a second reaction source may be injected thereinto. The second reaction source may be, for example, one or more gases selected from a group consisting of $O_2$, $O_3$, $N_2$, and $NH_3$.

In the case that the insulating film including silicon is a silicon oxide film, the second reaction source may be a gas having an oxygen atom such as $O_2$ or $O_3$. In the case that the insulating film including silicon is a silicon nitride film, the second reaction source may be a gas having a nitrogen atom such as $N_2$ or $NH_3$.

In order to form the silicon thin film as the insulating film including silicon, for example, as the silicon oxide film, the plasma atmosphere may be formed in the interior of the chamber, using $O_2$ or $O_3$ as an ignition gas. In order to form the silicon thin film as the insulating film including silicon, for example, as the silicon nitride film, the plasma atmosphere may be formed in the interior of the chamber, using $N_2$ or $NH_3$ as an ignition gas.

Then, a second purge S400 may be performed to remove the reaction by-products and reaction gas or ignition gas from the interior of the chamber.

In order to obtain a desired thickness of the insulating film including silicon, processes in which the silicon thin film is formed in S200, the silicon thin film formed on the surface of the substrate is formed as the insulating film including silicon in S300, and the second purge S400 is performed may be repeatedly performed in S500, as necessary.

In the case that the insulating film including silicon is formed to have the desired thickness, the substrate may be unloaded from the chamber in S600.

Figure 2:
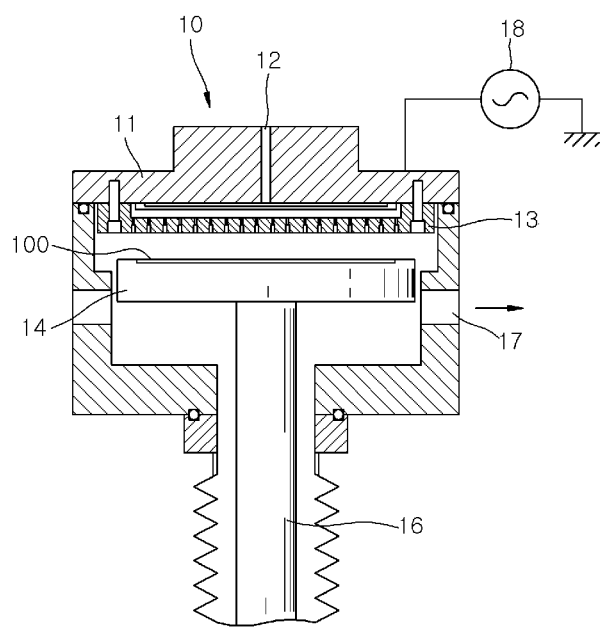
FIG. 2 is a schematic cross-sectional view of a semiconductor manufacturing apparatus, illustrating a cyclic deposition method for thin film formation according to an exemplary embodiment in the present disclosure.

FIG. 2 is a schematic cross-sectional view of a semiconductor manufacturing apparatus, illustrating a cyclic deposition method for thin film formation according to an exemplary embodiment in the present disclosure. As illustrated in FIG. 2, an entryway 12 may be formed to allow the reaction source to be introduced to a chamber 11 of a semiconductor manufacturing apparatus 10. The reaction source gas provided via the entryway 12 may pass through a shower head 13 and be sprayed into the chamber 11. A substrate 100 to have a thin film deposited thereon may be positioned on a chuck 14, and the chuck 14 may be supported by a chuck support 16. The chuck 14, when necessary, may apply heat to the substrate 100 to allow the substrate 100 to have a predetermined temperature. After a deposition process is performed using such equipment, residues in the chamber 11 may be expelled through an outlet 17. Also, the semiconductor manufacturing apparatus 10 may include a plasma generator 18 for the formation of a plasma atmosphere.

FIG. 3 is a diagram illustrating a process of the cyclic deposition method for thin film formation according to an exemplary embodiment in the present disclosure. Referring to FIG. 3, an injection of a silicon precursor and a purge may be performed repeatedly. After the injection of the silicon precursor and the purge are respectively performed several times repeatedly, a plurality of plasma atmospheres may be formed in sequence. In a state in which a plasma atmosphere is formed, the first and the second reaction sources may respectively be injected, as necessary.

Thus, the process of the repeated injection of the silicon precursor and purge up to the formation of the plasma atmosphere in sequence may be performed in a single cycle. In other words, the processes in which the silicon thin film is formed through the repeated processes of injection of the silicon precursor and purges, the first plasma atmosphere is formed to perform preprocessing, and the second plasma atmosphere is formed to form the insulating film including silicon may be performed in a single cycle.

Therefore, in the cyclic deposition method for thin film formation, not only the injection of the silicon precursor and the purge may be performed repeatedly, but the formation of the silicon thin film and the formation of the insulating film may also be performed repeatedly.

On the basis of the foregoing descriptions, processes of the cyclic deposition method for thin film formation according to an exemplary embodiment in the present disclosure will be described in detail with reference to FIGS. 4A to 7. In the descriptions of FIGS. 4A to 7, the same reference numerals as those of FIGS. 1 to 3 may be used.

Figure 4A:
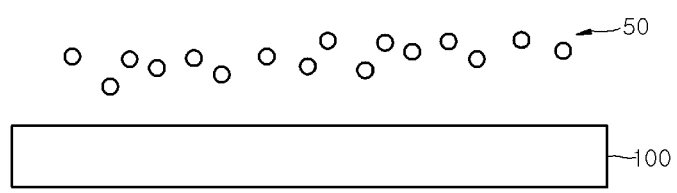
FIGS. 4A to 4C are cross-sectional views illustrating a deposition of silicon according to an exemplary embodiment in the present disclosure.
Figure 4B:
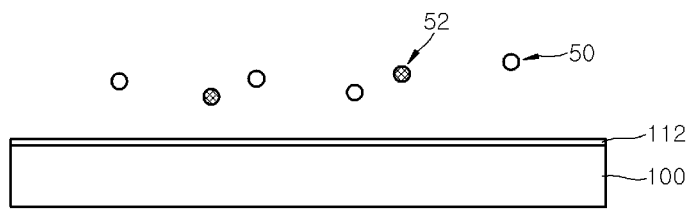
Figure 4C:
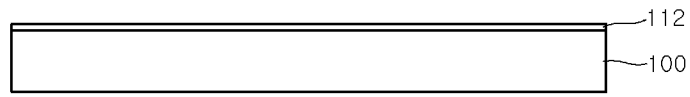

FIGS. 4A to 4C are cross-sectional views illustrating the deposition of the silicon according to an exemplary embodiment in the present disclosure. FIG. 4A is a cross-sectional view illustrating the injection of the silicon precursor according to an exemplary embodiment in the present disclosure.

As illustrated in FIG. 4A, a silicon precursor 50 may be injected into the chamber 11 in which the substrate 100 is loaded. Examples of the substrate 100 may include a semiconductor substrate, such as a silicon semiconductor wafer or a compound semiconductor wafer. Here, the substrate 100 may include a substrate material different from a material of the semiconductor, such as glass, metal, ceramic, quartz, or the like. The silicon precursor 50, for example, may be a precursor of amino-based silane, such as bisethylmethylaminosilane (BEMAS), bisdimethylaminosilane (BDMAS), BDEAS, tetrakisethylmethylaminosilane (TEMAS), tetrakisdimethylaminosilane (TDMAS), and TEDAS, a precursor of chloride-based silane, such as hexachlorodisilane (HCD), or a silane-based precursor including silicon and hydrogen. The substrate 100 may be maintained at a temperature of 50 to 600° C., for example, so that the substrate 100 may react with the silicon precursor 50. Also, a pressure in the interior of the chamber 11, in which the substrate 100 is loaded, may be maintained at 0.01 to 10 Torr, for example.

FIG. 4B is a cross-sectional view illustrating a state in which the silicon is deposited on the surface of the substrate according to an exemplary embodiment in the present disclosure. As illustrated in FIG. 4B, a portion of the silicon precursor 50 may react with the substrate 100, to allow silicon atoms to be deposited on the surface of the substrate 100 so as to form a silicon layer 112 thereon. The silicon layer 112 may be configured of one or more silicon atomic layers. The silicon precursor 50 may react with the substrate 100, and may form by-products 52. Also, a portion of the silicon precursor 50 may not react with the substrate 100 and may remain in an unreacted state.

FIG. 4C is a cross-sectional view illustrating a state in which the first purge has been performed according to an exemplary embodiment in the present disclosure. As illustrated in FIG. 4C, after the silicon layer 112 is formed on the surface of the substrate 100, the purge may be performed to remove the remaining unreacted silicon precursor 50 and the reaction by-products 52 from the interior of the chamber 11. The purge process in which the remaining unreacted silicon precursor 50 and the reaction by-products 52 are removed from the interior of the chamber 11 may be known as the first purge.

During the first purge, the substrate 100 may be maintained at a temperature of 50 to 600° C., for example. Also, the pressure in the interior of the chamber 11, in which the substrate 100 is loaded, may be maintained at 0.01 to 10 Torr, for example. For example, during a deposition of the silicon layer 112 and the first purge, the temperature of the substrate 100 and the pressure in the interior of the chamber 11 may be maintained at a constant level.

Figure 5:
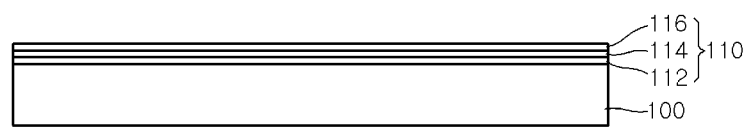
FIG. 5 is a cross-sectional view illustrating a state in which a plurality of silicon thin films are formed according to an exemplary embodiment in the present disclosure.

FIG. 5 is a cross-sectional view illustrating a state in which a plurality of silicon thin films are formed according to an exemplary embodiment in the present disclosure. As illustrated in FIG. 5, the processes described with reference to FIGS. 4A to 4C may be repeated, to deposit a plurality of silicon layers 112, 114, and 116 on the surface of the substrate 100, so as to form the silicon thin film 110 formed using amorphous silicon or polysilicon having polycrystalline characteristics. The silicon thin film 110, for example, may have a thickness of 1 to 10 Å. The deposition of the silicon thin film 110 and the first purge may be performed repeatedly 1 to 10 times, so that the silicon thin film 110 may include 3 to 10 silicon layers 112, 114, and 116. As the silicon thin film 110 may be configured of the plurality of silicon layers 112, 114, and 116 in this manner, the silicon thin film 110 may have excellent film qualities and step coverage.

Figure 6:
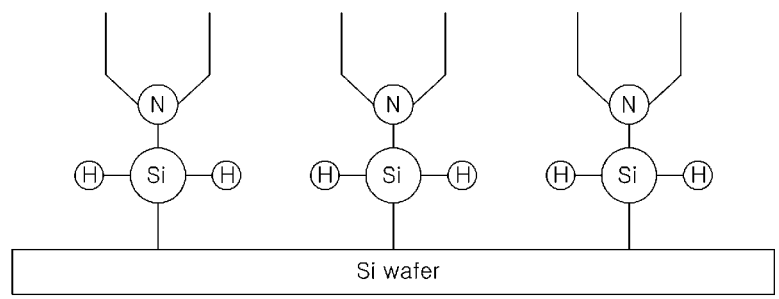
FIG. 6 is a schematic diagram illustrating a silicon thin film according to an exemplary embodiment in the present disclosure.

FIG. 6 is a schematic diagram illustrating the silicon thin film according to an exemplary embodiment in the present disclosure, and here, bisdiethylaminosilane (BDEAS, SiH$_2$[N(C$_2$H$_5$)$_2$]$_2$) may be used as the silicon precursor 50. As can be seen in the example of BDEAS, the silicon precursor 50 may include silicon atoms and hydrogen atoms. As illustrated in FIG. 6, the silicon thin film 110 may include the silicon atoms and the hydrogen atoms included in a molecular structure of the silicon precursor 50, and the silicon atoms and the hydrogen atoms may be included in the molecular structure of the silicon precursor 50.

In a state in which the silicon thin film 110 is formed on the surface of the substrate 100, the silicon atoms may be absorbed onto the surface of the substrate 100 and the hydrogen atoms may be combined with the silicon atoms. Thus, density of the silicon precursor 50 absorbed onto the surface of the substrate 100 may decrease due to the hydrogen atoms, and in the case that the hydrogen atoms exist in a form of a silicon-hydrogen (Si—H) compound in the insulating film (a silicon oxide film or a silicon nitride film) through a succeeding process, a problem may occur in terms of an increased wet etch rate, due to increased porosity in the insulating film. A process to resolve this problem is described hereafter.

Figure 7A:
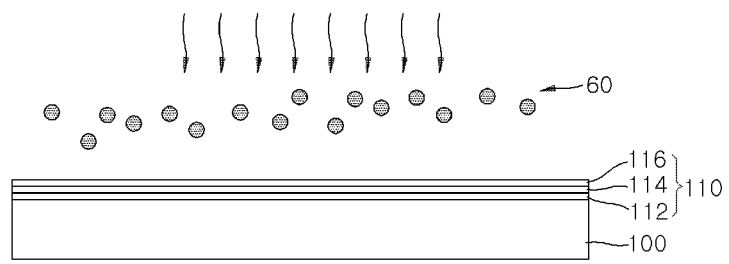
FIG. 7A is a cross-sectional view illustrating pre-processing of a silicon thin film according to an exemplary embodiment in the present disclosure.

FIG. 7A is a cross-sectional view illustrating pre-processing of the silicon thin film according to an exemplary embodiment in the present disclosure. As illustrated in FIG. 7A, a plasma may be applied to the surface of the substrate 100, on which the silicon thin film 110 is formed. For example, a plasma atmosphere may be formed in the interior of the chamber 11, in which the substrate 100 has been loaded. In order to form the plasma atmosphere, an Inductively Coupled Plasma (ICP) method, a Capacitively Coupled Plasma (CCP) method, or a Microwave (MW) Plasma method may be used. Here, in order to form the plasma atmosphere, 10 W to 3 kW of power may be used.

In order to form the plasma atmosphere, one or more ignition gases selected from a group including Ar, He, Kr, and Xe, for example, may be injected, as well as a first reaction source 60 having a hydrogen atom, such as NH$_3$ or H$_2$, for example. In this case, the ignition gas may be injected in an amount of 100 to 3000 sccm, for example, and the first reaction source 60 may be injected in an amount of 10 to 2000 sccm, for example. Here, in order to form the plasma atmosphere, one or more first reaction sources 60 selected from the group including, for example, $NH_3$ or $H_2$, may be injected. At this time, the first reaction source 60 may act as the ignition gas, and a separate ignition gas may not be injected. In order to pre-process the surface of the silicon thin film 110 in the plasma atmosphere, a pressure in the chamber 11 in which the substrate 100 is loaded may be maintained at 0.01 to 10 Torr, for example. Then, a second purge may be performed to remove the remaining first reaction source 60 or reaction by-products.

The pre-processing described above may reduce the porosity of the silicon thin film 110 and densify a structure of the silicon thin film by removing hydrogen atoms from the silicon thin film 110. For example, in the pre-processing, hydrogen atoms included in the first reaction source 60 may be converted into radical form in the plasma atmosphere, and the combination of the silicon atoms and the hydrogen atoms in the silicon thin film 110 may be broken by the hydrogen radical. Then, the hydrogen atoms in the silicon thin film 110 may be removed by the hydrogen radical combined with the hydrogen atoms in the silicon thin film 110 and generating hydrogen ($H_2$) gas. Thus, the silicon thin film 110 may have reduced porosity and a dense structure through the pre-processing.

On the other hand, unlike the exemplary embodiment of the present disclosure, the first reaction source 60 including the hydrogen atom may be replaced by a gas including an oxygen atom, such as $N_2O$, $O_2$, or $O_3$. In the pre-processing, the oxygen atom included in the first reaction source 60 may be converted into a radical form in the plasma atmosphere, and the combination of the silicon atoms and the hydrogen atoms in the silicon thin film 110 may be broken by the oxygen radical. Then, the hydrogen atoms in the silicon thin film 110 may be removed by the oxygen radical combined with the hydrogen atoms in the silicon thin film 110 and thus generating water ($H_2O$). However, comparing a case in which the first reaction source 60 may be a gas including the hydrogen atom with a case in which the first reaction source 60 may be a gas including the oxygen atom, considering bond energy, the hydrogen atom in the silicon thin film 110 may be easily removed in the former case, in which the first reaction source 60 may be a gas including the hydrogen atom, and therefore, the case in which the first reaction source 60 may be a gas including the hydrogen atom may be applied.

Figure 7B:
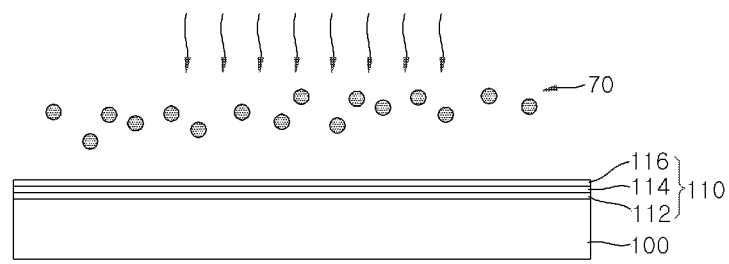
FIG. 7B is a cross-sectional view illustrating a process in which the silicon thin film is formed as an insulating film including silicon according to an exemplary embodiment in the present disclosure.

FIG. 7B is a cross-sectional view illustrating a process in which the silicon thin film is formed as an insulating film including silicon according to an exemplary embodiment in the present disclosure. As illustrated in FIG. 7B, plasma may be applied to the surface of the substrate 100, on which the silicon thin film 110 is formed. For example, the plasma atmosphere may be formed in the interior of the chamber 11, in which the substrate 100 is loaded. In order to form the plasma atmosphere, the Inductively Coupled Plasma (ICP) method, the Capacitively Coupled Plasma (CCP) method, or the Microwave (MW) Plasma method may be used. Here, in order to form the plasma atmosphere, the 10 W to 3 kW of power may be used.

In order to form the plasma atmosphere, one or more ignition gases selected from a group including, for example, Ar, He, Kr, and Xe may be injected, as well as one or more second reaction sources 70 selected from a group including, for example, $O_2$, $O_3$, $N_2$, and $NH_3$. Here, the ignition gas may be injected in an amount of 100 to 3000 sccm, for example. Alternatively, in order to form the plasma atmosphere, one or more second reaction sources 70 selected from a group including, for example, $O_2$, $O_3$, $N_2$, and $NH_3$ may be injected. In this case, the second reaction source 70 may act as the ignition gas, and a separate ignition gas may not be injected.

In an example of the second reaction source 70, in the case of using a gas including an oxygen atom such as $O_2$ and $O_3$, the silicon thin film 110 may react with the oxygen atom included in the second reaction source 70 and be formed as a silicon oxide film. Alternatively, in an example of the second reaction source 70, in the case of using a gas including a nitrogen atom such as $N_2$ and $NH_3$, the silicon thin film 110 may react with the nitrogen atom included in the second reaction source 70 to be formed as a silicon nitride film.

In order to allow the silicon thin film 110 to change to and be formed as an insulating film including silicon, such as a silicon oxide film or a silicon nitride film, in the plasma atmosphere, to be described below, a pressure in the chamber 11 in which the substrate 100 is loaded may be maintained at 0.05 to 10 Torr, for example.

Figure 7C:
FIG. 7C is a cross-sectional view illustrating a state in which a second purge has been performed according to an exemplary embodiment in the present disclosure.

FIG. 7C is a cross-sectional view illustrating a state in which the second purge has been performed according to an exemplary embodiment in the present disclosure. Referring to FIGS. 7B and 7C, a third purge may be performed to remove the remaining second reaction source 70 and reaction by-products, and an insulating film 120a including silicon may be formed. The insulating film 120a including silicon may be, for example, a silicon oxide film or a silicon nitride film.

The insulating film 120a including silicon, such as a silicon oxide film or a silicon nitride film, formed in the plasma atmosphere, may have excellent film qualities. Even when the insulating film 120a including silicon is formed to have a relatively small thickness, excellent film qualities may be obtained. Also, as described above, the silicon thin film 110 may have excellent film qualities and step coverage, and therefore, the insulating film 120a including silicon may also have excellent film qualities and step coverage. In further detail, since the insulating film 120a including silicon may be formed in the plasma atmosphere, better film qualities may be obtained.

Figure 8:
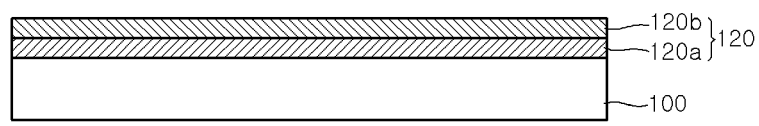
FIG. 8 is a cross-sectional view illustrating a state in which an insulating film including silicon is formed according to another exemplary embodiment in the present disclosure.

FIG. 8 is a cross-sectional view illustrating a state in which the insulating film including silicon is formed according to another exemplary embodiment in the present disclosure. Referring to FIGS. 7A to 7C, by repeatedly performing the processes described with reference to FIGS. 4A to 7C, an insulating film 120 including a plurality of insulating films 120a and 120b containing silicon may be formed.

In a case in which the silicon thin film 110 is configured of an insulating film 120a including silicon, as illustrated in FIG. 7B, the silicon thin film 110 may be transformed into the insulating film starting from an exposed surface thereof. Thus, in a case in which the silicon thin film 110 is relatively thick, oxygen or nitrogen reacting with the silicon thin film 110 may need to penetrate the insulating film formed on the surface of the silicon thin film 110 so as to be diffused. Thus, a speed of the formation of the insulating film may decrease as the thickness of the silicon thin film 110 increases.

In a case in which the insulating film 120 to be formed is relatively thick, a processing time may be reduced by repeatedly performing a process of forming a relatively thin silicon thin film and forming the formed silicon thin film as an insulating film including silicon, in comparison with the case in which a relatively-thick silicon thin film is formed and then formed as an insulating film at once. Thus, the number of repetitions of the processes described with reference to FIGS. 4A to 7C may be determined with consideration for a processing time and the thickness required by the insulating film including silicon. Also, the insulating film 120 is illustrated as including 2 insulating films 120a and 120b including silicon; however, the insulating film may also include 3 or more insulating films including silicon.

Figure 9:
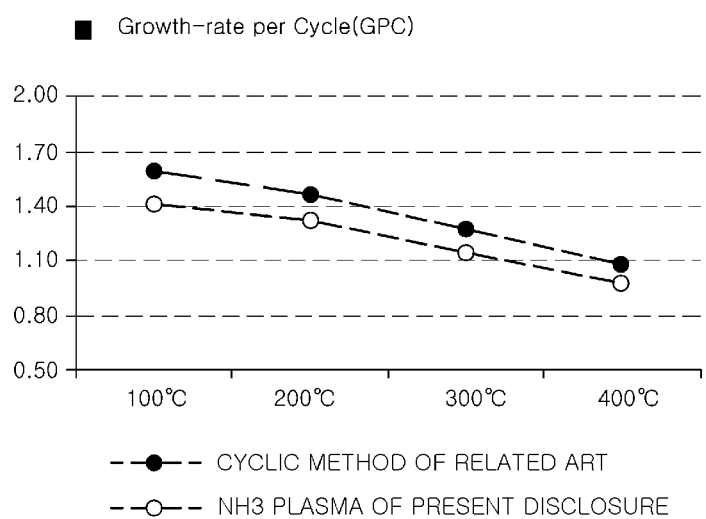
FIG. 9 is a graph illustrating a growth rate of the insulating film according to an exemplary embodiment in the present disclosure.

FIG. 9 is a graph illustrating a growth rate of the insulating film according to an exemplary embodiment in the present disclosure. In the case of deposition of the insulating film omitting the pre-processing and in the case of deposition of the insulating film after pre-processing, a growth rate of a single cycle is calculated as a value of the thickness of the insulating film divided by the number of total cycles repeated during the deposition process, and the growth rate is the average value in regard to an entire area of the substrate 100. As illustrated in FIG. 9, it can be confirmed that the growth rate of the insulating film 120 including the pre-processing is about 10% higher than the growth rate of the insulating film omitting the pre-processing.

The above results may be explained as the following. In the pre-processing process, the hydrogen atoms included in the silicon precursors 50 may be removed from the silicon thin film 110 while reducing a volume of the silicon thin film 110, thereby increasing a density of the deposition of the silicon thin film 110, and at the same time, allowing the silicon precursors 50 to be dispersed evenly on the surface of the substrate 100. Therefore, the silicon precursor 50 may be absorbed evenly onto the surface of the silicon thin film 110 in succeeding cycles, and the growth rate, which is the average value of the insulating film in regard to the entire area of the substrate 100, may increase. On the other hand, in the case in which the pre-processing is omitted, the silicon precursor 50 may be dispersed unevenly on only a portion of the surface of the substrate 100, and the silicon precursor 50 may not be absorbed evenly onto the surface of the silicon thin film 110 in succeeding cycles, and the growth rate, which is the average value of the insulating film in regard to the entire area of the substrate 100, may decrease.

Figure 10:
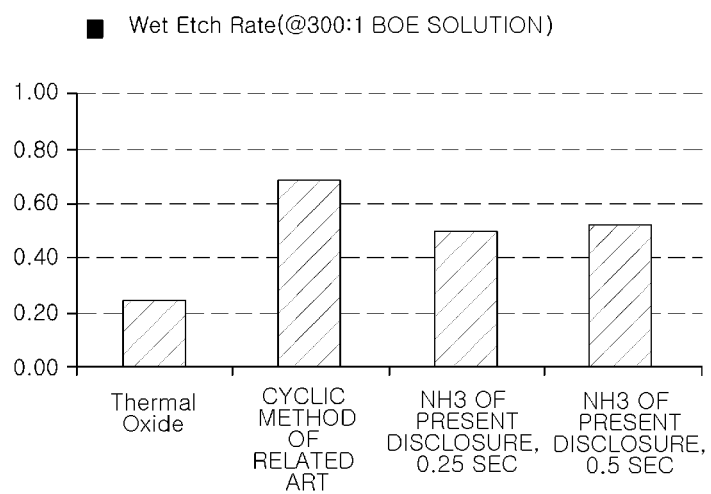
FIG. 10 is a graph illustrating a wet etch rate of the insulating film according to an exemplary embodiment in the present disclosure.

FIG. 10 is a graph illustrating a wet etch rate (in the case of buffered oxide etch (BOE) solution of 300:1) of the insulating film according to an exemplary embodiment in the present disclosure. As illustrated in FIG. 10, the wet etch rate of the insulating film deposited through a thermal chemical vapor deposition is 0.24, and the wet etch rate of the insulating film deposited through the cyclic deposition method for thin film formation according to the related art (omitting the pre-processing) is 0.69. However, according to the cyclic deposition method for thin film formation described above, the wet etch rate of the insulating film 120 is 0.49 (pre-processing duration=0.25 seconds) or 0.52 (pre-processing duration=0.5 seconds), and it can be appreciated that the wet etch rate of the insulating film in an exemplary embodiment of the present disclosure decreases by about 25% compared with that of the cyclic deposition method for thin film formation according to the related art (omitting the pre-processing). Through this result, it can be seen that a structure of the insulating film 120 formed according to an exemplary embodiment in the present disclosure becomes more dense compared with that of the cyclic deposition method for thin film formation according to the related art (omitting the pre-processing).

According to an exemplary embodiment in the present disclosure, the insulating film having a dense structure may be deposited, whereby the wet etch rate may decrease. Also, the insulating film having excellent film qualities and step coverage may be deposited.

While exemplary embodiments have been shown and described above, it will be apparent to those skilled in the art that modifications and variations could be made without departing from the scope of the present invention as defined by the appended claims.

What is claimed is:

1. A cyclic deposition method for thin film formation, comprising:
   forming a silicon thin film on an object by injecting a silicon precursor into a chamber in which the object is loaded, depositing silicon on the object, and performing a first purge, removing an unreacted portion of the silicon precursor and reaction by-products from the interior of the chamber;
   after forming the silicon thin film, pre-processing a surface of the silicon thin film by forming a plasma atmosphere in the chamber and supplying a first reaction source having a hydrogen atom; and
   after pre-processing the surface of the silicon thin film, forming the silicon thin film as an insulating film including silicon, by forming the plasma atmosphere in the chamber and supplying a second reaction source having one or more oxygen atoms, one or more nitrogen atoms, or a mixture thereof,
   wherein the insulating film has a wet etch rate of 0.4 to 0.6.

2. The cyclic deposition method for thin film formation of claim 1, wherein the first reaction source is one or more gases selected from a group consisting of $NH_3$ and $H_2$.

3. The cyclic deposition method for thin film formation of claim 1, wherein the second reaction source is one or more gases selected from a group consisting of $O_2$, $O_3$, $N_2$, and $NH_3$.

4. The cyclic deposition method for thin film formation of claim 1, wherein the pre-processing lasts 0.05 to 10 seconds.

5. The cyclic deposition method for thin film formation of claim 1, wherein the pre-processing is performed under chamber pressure conditions of 0.01 to 10 Torr, where a temperature of the object is 50 to 600° C.

6. The cyclic deposition method for thin film formation of claim 1, wherein the forming of the silicon thin film and the forming of the insulating film are performed under chamber pressure conditions of 0.01 to 10 Torr.

7. The cyclic deposition method for thin film formation of claim 1, wherein the silicon precursor comprises any one of an amino silane or a chloride silane.

8. The cyclic deposition method for thin film formation of claim 1, wherein the insulating film including silicon is a silicon oxide film or a silicon insulating film.

9. The cyclic deposition method for thin film formation of claim 1, wherein the pre-processing or the forming of the insulating film comprises injecting one or more ignition gases selected from a group consisting of Ar, He, Kr, and Xe.

10. The cyclic deposition method for thin film formation of claim 9, wherein the first reaction source is injected in an amount of 10 to 2000 sccm,
    the ignition gas is injected in an amount of 100 to 3000 sccm, and
    the second reaction source is injected in an amount of 10 to 500 sccm.

11. The cyclic deposition method for thin film formation of claim 1, wherein the cyclic deposition method for thin film formation further comprises performing a second purge removing reaction by-products from the interior of the chamber after the formation of the insulating film, and
    the forming of the silicon thin film, the pre-processing, the forming of the insulating film, and the second purge are performed repeatedly.

12. The cyclic deposition method for thin film formation of claim 1, wherein the forming of the silicon thin film comprises repeating the deposition and the first purge 1 to 10 times.

13. The cyclic deposition method for thin film formation of claim 1, wherein the silicon thin film comprises amorphous silicon or polysilicon having polycrystalline characteristics.

14. A semiconductor manufacturing method, comprising depositing the insulating film using the cyclic deposition method of claim 1.

15. A semiconductor manufacturing method, comprising depositing the insulating film using the cyclic deposition method of claim 2.

\* \* \* \* \*